(12) United States Patent
Osaka et al.

(10) Patent No.: US 7,498,520 B2
(45) Date of Patent: Mar. 3, 2009

(54) SEMICONDUCTOR MULTILAYER WIRING BOARD AND METHOD OF FORMING THE SAME

(75) Inventors: Tetsuya Osaka, Tokyo (JP); Tokihiko Yokoshima, Tokyo (JP); Isao Sato, Kawasaki (JP); Akira Hashimoto, Kawasaki (JP); Yoshio Hagiwara, Kawasaki (JP)

(73) Assignees: Waseda University, Tokyo (JP); Tokyo Ohka Kogyo Co., Ltd., Kanagawa Prefecture (JP)

( * ) Notice: Subject to any disclaimer, the term of this patent is extended or adjusted under 35 U.S.C. 154(b) by 560 days.

(21) Appl. No.: 10/965,868

(22) Filed: Oct. 18, 2004

(65) Prior Publication Data

US 2005/0110149 A1 May 26, 2005

(30) Foreign Application Priority Data

Oct. 17, 2003 (JP) ............................. 2003-358433
Sep. 13, 2004 (JP) ............................. 2004-265445

(51) Int. Cl.
H05K 3/02 (2006.01)
H05K 1/00 (2006.01)
(52) U.S. Cl. ...................................... 174/250; 29/846
(58) Field of Classification Search ................. 174/250; 361/748; 29/846, 831
See application file for complete search history.

(56) References Cited

U.S. PATENT DOCUMENTS

| | | | | |
|---|---|---|---|---|
| 4,729,061 A | * | 3/1988 | Brown ........................ | 361/719 |
| 5,191,174 A | * | 3/1993 | Chang et al. ................ | 174/266 |
| 5,347,712 A | * | 9/1994 | Yasuda et al. ................ | 29/852 |
| 5,889,233 A | * | 3/1999 | Shimoto et al. ............. | 174/250 |
| 6,590,165 B1 | * | 7/2003 | Takada et al. ............... | 174/266 |
| 2003/0008075 A1 | | 1/2003 | Ueno et al. | |

FOREIGN PATENT DOCUMENTS

| | | |
|---|---|---|
| JP | 10-310872 | 11/1998 |
| JP | 2003-51538 | 2/2003 |

* cited by examiner

*Primary Examiner*—Jeremy C. Norris
*Assistant Examiner*—Abiy Getachew
(74) *Attorney, Agent, or Firm*—Wenderoth, Lind & Ponack, L.L.P.

(57) ABSTRACT

A silica-based interlayer insulating layer having a low dielectric constant is formed with SOG material on a substrate, in which a wiring-layer forming space is then formed. If necessary, a UV ray irradiation is performed under an oxidizing atmosphere. A Si—OH bond is formed on a surface of the insulating layer. A monomolecular layer film is then adhered to the inner surface of the space, which is then modified to be a catalyst with a solution containing Pd compound. On the catalyst monomolecular layer, a copper-diffusion-resistant film is formed by electroless plating, on which a copper plate is then formed as a wiring layer.

9 Claims, 5 Drawing Sheets

SEMICONDUCTOR MULTILAYER WIRING BOARD AND METHOD OF FORMING THE SAME

BACKGROUND OF THE INVENTION

1) Field of the Invention

The present invention relates to a semiconductor multilayer wiring board having a semiconductor multilayer wiring which has a lower wiring layer formed on a semiconductor substrate, and an upper wiring layer formed on the lower wiring layer via a interlayer insulating layer The lower wiring layer and the upper wiring layer are connected to each other via a via-wiring vertically penetrating the interlayer insulating layer The present invention also relates to a method of forming such a semiconductor multilayer wiring board. In more detail, the present invention relates to a semiconductor multilayer wiring board in which the via-wiring and the lower and upper wiring layers are formed by a simple dual damascene process, and all layers from the interlayer insulating layer to the wiring layers are formed by a wet method, and relates to a method of forming such a semiconductor multilayer wiring board.

2) Description of the Related Art

As well known, a basic wiring structure in a semiconductor integrated circuit has a lower wiring layer directly or indirectly formed on a semiconductor substrate and an upper wiring layer formed on the lower wiring layer via an interlayer insulating layer, and the lower wiring layer and the upper wiring layer are connected to each other via a via-wiring which penetrates the interlayer insulating layer. With such a wiring structure being made plural and multilayered, a multilayer wiring structure of a semiconductor integrated circuit is formed.

Conventionally, this wiring structure has been achieved by repetition of laminating procedures of layers such as the conductive layers and the interlayer insulating layer on the semiconductor substrate and etching procedures for patterning of these layers. Such a method of sequentially forming a multilayered wiring by repetition of lamination and etching requires a large number of steps, which tends to raise manufacturing cost. Therefore, at present, an inlaying scheme generally called a damascene process is adopted. In the damascene process, a via hole or a wiring ditch called a trench for forming a via-wiring and an upper wiring layer is formed in advance on an interlayer insulating layer, and then a conductive material is embedded in that space. In the damascene process, a process of simultaneously forming a via-wiring and an upper wiring layer is particularly called a dual damascene process. Adopting this damascene process makes it possible to use copper, which used to be unavailable as a conductive material. That is, although copper is a suitable material as a conductive material for fine wiring because copper has an excellent electromigration resistance compared with aluminum, copper used to be unavailable in the conventional multilayer-wiring sequential forming method due to difficulty in etching. By using the damascene process, however, copper can be eventually used as a conductive material.

A basic procedure of the damascene process will be described with reference to FIGS. 1A to 1D and 2E to 2H.

First, as shown in FIG. 1A, on a substrate 1, an interlayer insulating layer 2 is formed by a CVD method, a spin coating method, or the like. The material constituting this interlayer insulating layer 2 may usually be a $SiO_2$ coating which may be formed by a spin-on-glass (SOG) scheme, a CVD scheme, or the like. On this interlayer insulating layer 2, a resist film 3 is formed and patterned. With this patterned resist film 3 as a mask, the interlayer insulating layer 2 is selectively etched, and then the resist film 3 is removed, thereby forming a wiring ditch (trench) 4 as shown in FIG. 1B. If necessary, on a surface of the interlayer insulating layer 2 with the wiring trench 4 formed thereon, an adhesion layer (not shown), such as a metal-tantalum thin film, is subsequently formed. On the adhesion layer, a barrier metal is then deposited, thereby forming a barrier metal film 5 on the inner surface of the wiring trench 4 for preventing copper to be embedded in the wiring trench 4 from being diffused into the interlayer insulating layer 2. If necessary, a copper seed layer (not shown) is then formed as shown in FIG. 1C. Then, copper is embedded in the wiring trench 4 by electrolytic plating or the like, to form a lower wiring layer 6.

Subsequently, the copper adhered at this time on the surface of the interlayer insulating layer 2 and the remaining barrier metal are removed by chemical polishing (CMP) to planarize the surface of the interlayer insulating layer 2. Then, on that surface, a capping layer 7 is formed. Then, a first low-dielectric layer 8, a first etching-stopper film 9, a second low-dielectric layer 10, and a second etching-stopper film 11 are sequentially laminated. Subsequently, on the second etching-stopper film 11, a resist mask 12 having a pattern for forming a via hole is formed. Subsequently, as shown in FIG. 1D, etching is performed with the resist mask 12 to form a via hole 13 penetrating the second etching-stopper film 11, the second dielectric layer 10, the first etching-stopper film 9, the first low-dielectric layer 8, and the capping layer 7 and reaching the surface of the lower wiring layer 6. Subsequently, as shown in FIG. 2E, the via hole 13 is filled with an embedment material 14, such as a photoresist material. Being etched back, as shown in FIG. 2F, the embedment material 14 is left for a predetermined thickness at the bottom of the via hole 13. Furthermore, on the second etching-stopper film 11, a resist mask 15 having a pattern for forming a trench is formed. By using this resist mask 15, as shown in FIG. 2G, the second etching-stopper film 11 and the second low-dielectric layer 10 are etched to form a trench 16, and simultaneously the embedment material 14 remaining at the bottom of the via hole 13 is removed. If necessary, on the inner surfaces of the via hole 13 and the trench 16, an adhesion layer (not shown), such as a metal-tantalum thin film, is then formed. Subsequently, on this adhesion layer, a barrier metal film (copper-diffusion-preventive film) 17 is formed. If necessary, a copper seed layer (not shown) is then formed on the via hole 13 and the trench 16. Then copper is embedded to form a via-wiring 18 and an upper wiring layer 19, as shown in FIG. 2H. Then, at least on the upper wiring layer 19, a capping layer 20 is formed if necessary. With the process mentioned above, a multilayer wiring structure is achieved in which the lower wiring layer 6 and the upper wiring layer 19 are electrically connected to each other via the via-wiring 18.

In the multilayer wiring structure, as described above, the wiring layers 6 and 19 and the via-wiring 18 are made of copper (Cu). With Cu in each wiring layer being diffused to the interlayer insulating layers 2, 8, and 10, the low dielectric property of the low-dielectric material forming the interlayer insulating layers is impaired, thereby causing an insulation defect. For preventing this problem, it is necessary to place anti-diffusion layers, such as the barrier metal layers 5 and 17 and the capping layers 7 and 20, each between a wiring layer and its surrounding interlayer insulating layer, for preventing Cu from diffusing into the interlayer insulating layers. Conventionally, anti-diffusion films made of TaN, TiN or the like formed by a sputtering method have been mainly used. When the wiring layer 19 is formed on the anti-diffusion layer 17 by electroplating, particularly copper electroplating as shown in FIG. 3 which is an enlarged view of main portions of FIGS. 2E to 2H, a Cu seed layer or the like serving as a conductive layer 21 must additionally be provided since the anti-diffusion layer 17 made of TaN, TiN, or the like is relatively low in conductivity.

In the first place, a main reason for adopting the dual damascene process to achieve such a multilayer wiring structure is that a cost reduction by applying such a simplified wet process is considered as being advantageous. Therefore, employment of spattering as described above which is a dry process upon making an anti-diffusion film and conductive layers is obviously not the best procedure.

As alternatives to this method, in recent years, a method of forming a semiconductor multilayer wiring board (a method of manufacturing a VLSI wiring board) has been disclosed in Japanese Patent Laid-Open Publication No. 2003-51538 (hereinafter referred to as "patent document") in which an anti-diffusion layer as well as a wiring layer and a capping layer can be all formed by a simple wet process with excellent adhesiveness. Also disclosed therein is a semiconductor multilayer wiring board (a VLSI wiring board) in which a capping layer having an excellent adhesiveness, uniformity, and thermal stability is formed by a plated coating.

In these methods of manufacturing a VLSI wiring board, upon manufacturing a VLSI wiring board in which wiring layers are separated by an interlayer insulator made of $SiO_2$ via an anti-diffusion layer, the $SiO_2$ surface forming the interlayer insulating portion is processed by a silane compound, and the surface is further modified to be a catalyst by an aqueous solution containing a palladium compound. Then, an anti-diffusion layer is formed by electroless plating. Subsequently, on this anti-diffusion layer, a wiring layer is formed. In this method, formation of the anti-diffusion layer by electroless plating preferably includes a step of forming a metallic nucleus by neutral or acid electroless plating and then a step of forming an anti-diffusion layer by alkaline electroless plating. The wiring layer may also be directly formed on the anti-diffusion layer by copper electroless plating or copper electroplating.

The methods disclosed in the patent document mentioned above are superior as a conventional method of forming a semiconductor multilayer wiring structure using a dual damascene process. However, if the wiring dimension is extremely finer, even with the use of a copper wiring having a small electrical resistance, an electric-signal speed is prone to decrease under the influence of the dielectric constant of the interlayer insulating film. It is desired to avoid such a delay of the electric-signal speed in the fine wiring.

Such a phenomenon in which the electric signal is delayed can be mitigated by decreasing the dielectric constant of the interlayer insulating film. For example, such an interlayer insulating film can be formed by a CVD method, a coating method such as SOD, etc. In the CVD method, a plasma TEOS (P-TEOS) $SiO_2$ film having a dielectric constant (k value) of approximately 4.1, a SiOF (FSG) film having a dielectric constant of approximately 3.7 to 3.4, a SiOC (carbon doped oxide) film having a dielectric constant of approximately 2.7 to 2.4 are known, for example. Classifying in terms of a coating method, a spin-on-glass (SOG)-based material, and an organic-polymer-based material are known. Known examples of the SOG-based material include a hydrogen silsesquioxane (HSQ) film having a dielectric constant of approximately 2.0 to 3.2, a porous HSQ film, a methylsilsesquioxane (MSQ) film having a dielectric constant of approximately 2.0 to 2.8, a porous MSQ film, and a porous $SiO_2$ film having a dielectric constant of approximately 1.8 to 2.2. Known examples of the organic-polymer-based material include a polyarylene-ether (PAE) film having a dielectric constant of approximately 2.6 to 2.8 film.

Of these materials, when an SOG-based material is used for coating to form an interlayer insulating layer, no expensive apparatus is required, an excellent throughput can be achieved, and most of the process of manufacturing a multilayer wiring substrate can be performed through a wet process. Therefore, the manufacturing process can be simplified and cost reduction can be achieved. As such, according to the coating method using an SOG-based material, an excellent effect can be achieved in which a multilayer wiring substrate can be formed at low cost.

The SOG-based material is mainly a solution formulated by dissolving a hydrolysate of alkoxysilane in an organic solvent.

However, when not only the CVD method and the SOG method described above but also a technology disclosed in the patent document of forming an anti-diffusion film by providing a palladium catalyst to an organic monomolecular film formed on an inner surface of a wiring-layer forming space formed by a dual damascene process is applied to an interlayer insulating layer formed with a silica-based material (silica-based interlayer insulating layer), there may be several problems to be solved. For example, depending on the type of material, the property of the surface of the obtained silica-based interlayer insulating layer may have an Si—H bond or an Si—R (R: alkyl group) bond. To form a silane-based monomolecular layer film, however, an Si—OH bond is required. If such an Si—OH bond is not present on the surface of the interlayer insulating layer, forming a silane-based monomolecular layer film is difficult. Another problem is how the surface of such an interlayer insulating layer should be processed. Yet another problem is in what way a monomolecular layer film of what type of structure should be formed on the surface of the processed silica-based interlayer insulating layer. Yet another problem is which material is suitable as a material for giving a catalyzing activity to the monomolecular layer film. Unless these problems are totally solved, it is impossible to provide a method of forming a semiconductor multilayer wiring board completely through a wet process from forming an interlayer insulating layer on a semiconductor substrate to embedding a wiring material in a wiring-layer forming space formed through a dual damascene process. As of now, such a method has not been provided yet.

SUMMARY OF THE INVENTION

Therefore, the problem to be solved by the present invention is to provide a semiconductor multilayer wiring board and a method of manufacturing the same in which a silica-based interlayer insulating layer having a low dielectric constant is formed on a substrate; a dense, thin anti-diffusion film is formed by a technique of forming an organic monomolecular film in a wet process, in a wiring forming space formed by a dual damascene process; and then a wiring layer is formed through a wet process, thereby solving problem of a electric-signal transmission delay associated with a finer wiring dimension. Another problem to be solved by the present invention is to provide a semiconductor multilayer wiring board obtained through a truly and completely wet-processed manufacturing method by forming the silica-based interlayer insulating layer by using an SOG-based material which is a wet process, and to provide such a manufacturing method.

To achieve the problems mentioned above, upon diligent studies and experiments, the inventors have confirmed the following.

Firstly, it has been confirmed that formation of a silica-based interlayer insulating layer can be achieved by forming a coating on a substrate by using a CVD or SOG material, preferably an SOG material; performing, if desired, a heating process on the coating at a specific temperature to form a baked coating; performing an etching process by a dual damascene process to form a wiring-layer forming space; and then performing a process of causing the Si—OH bond on the surface of the silica-based interlayer insulating layer.

As for forming an anti-diffusion film in the wiring-layer forming space formed through the dual damascene process in the silica-based interlayer insulating layer with its surface being processed, the inner surface of the wiring-layer forming space may be processed with an organic-silane compound, thereby causing a film made of a monomolecular layer of the organic-silane compound to be adhesive. The surface of the monomolecular layer film has an excellent smoothness and can also be easily modified to be a catalyst with an aqueous solution containing a palladium compound. The catalyst monomolecular layer film may be subjected to electroless plating, thereby forming a plated layer with a high copper-diffusion-preventive property on the monomolecular layer film. Thus, it has been confirmed that it is possible to form a thin anti-diffusion film with a high adhesiveness to the inner surface of the wiring-layer forming space and a high copper-diffusion-preventive property.

The present invention has been achieved based on the findings described above. The semiconductor multilayer wiring board according to the present invention includes a semiconductor multilayer wiring having a lower wiring layer formed on a semiconductor substrate, and an upper wiring layer formed on the lower wiring layer via a silica-based interlayer insulating layer having a low dielectric constant. The lower wiring layer and the upper wiring layer are connected to each other via a via-wiring vertically penetrating the interlayer insulating layer. The interlayer insulating layer has a wiring-layer forming space formed by a dual damascene process, wherein a silane-based monomolecular layer film is formed on an inner surface of the wiring-layer forming space A plated film is formed on a surface of the monomolecular layer film, and a wiring layer made of a copper-plated layer is formed on the plated film.

The method of forming a semiconductor multilayer wiring board according to the present invention is a method for forming a semiconductor multilayer wiring board including a semiconductor multilayer wiring having a lower wiring layer formed on a semiconductor substrate, and an upper wiring layer formed on the lower wiring layer via a silica-based interlayer insulating layer having a low dielectric constant. The lower wiring layer and the upper wiring layer are connected to each other via a via-wiring vertically penetrating the interlayer insulating layer. The method includes: an interlayer-insulating-layer forming step of forming on the substrate the silica-based interlayer insulating layer; an etching step of forming a wiring-layer forming space in the interlayer insulating layer by a dual damascene process; a treatment step of forming an Si—OH bond on a surface of the interlayer insulating layer; a monomolecular-layer-film forming step of processing an inner surface of the wiring-layer forming space with an organic-silane compound whereby a silane-based monomolecular layer film is adhered thereto; a catalyst surface forming step of treating a surface of the monomolecular layer film with an aqueous solution containing a palladium compound to give a catalyzing activity to the surface; a copper-diffusion-resistant-film forming step of forming a plated film with a high copper-diffusion resistant property on the catalyst monomolecular layer film by electroless plating, to obtain a copper-diffusion-resistant film; and a wiring-layer forming step of forming a copper-plated layer on the copper-diffusion-resistant film, to obtain a wiring layer.

As explained in the above, the present invention can provide a semiconductor multilayer wiring board obtained through a truly complete full wet-process in which the interlayer insulating layer having the low dielectric constant is formed on the substrate by a coating method. A dense and thin anti-diffusion film is formed by an organic monomolecular layer forming technique that is a wet process on the wiring-forming space that has been configured by the dual damascene process; and then a wiring layer is formed by a wet process. The present invention also provides the method for producing the same.

The other objects, features and advantages of the present invention are specifically set forth in or will become apparent from the following detailed descriptions of the invention when read in conjunction with the accompanying drawings.

Figure 1A:
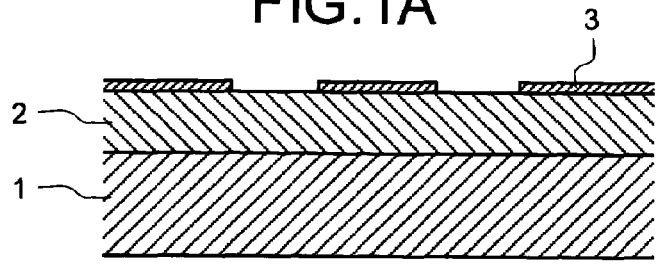
FIGS. 1A to 1D are views for explaining a first half of a process in a conventional method of forming a semiconductor multilayer wiring using a dual damascene process.
Figure 1B:
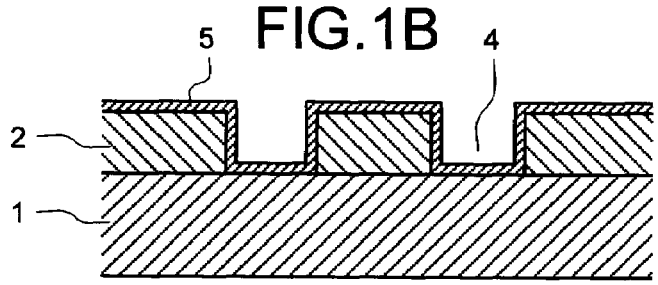
Figure 1C:
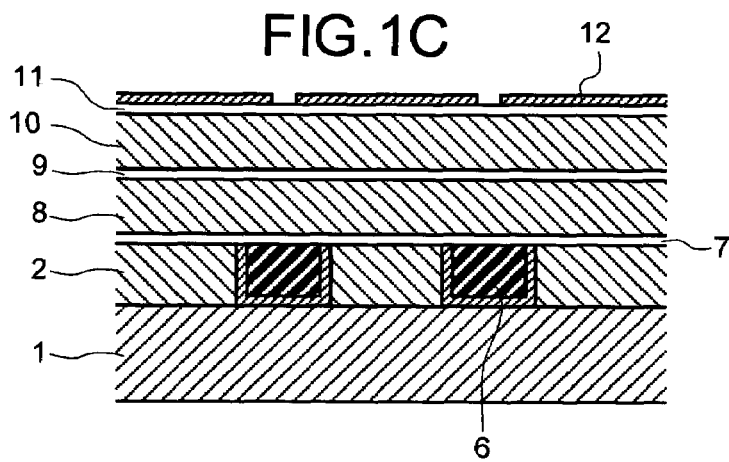
Figure 1D:
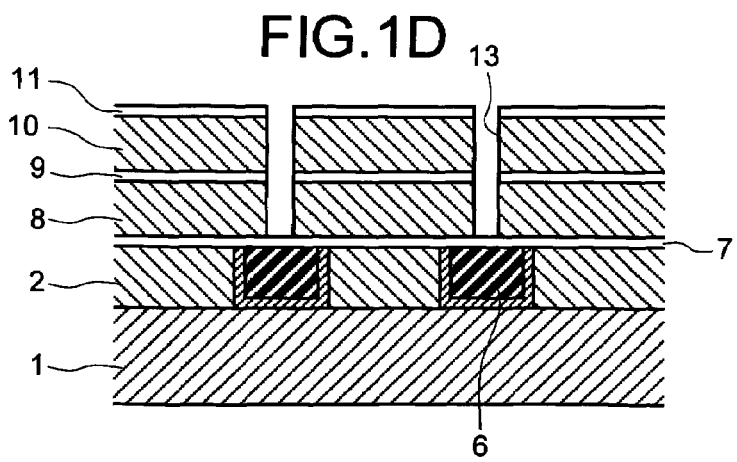
Figure 2E:
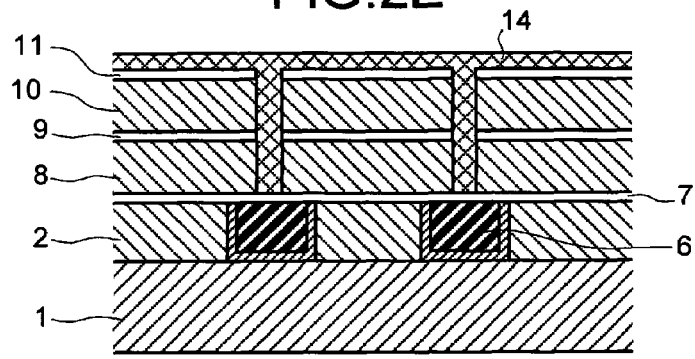
FIGS. 2E to 2H are views for explaining a second half of the process in the conventional method of forming a semiconductor multilayer wiring using the dual damascene process.
Figure 2F:
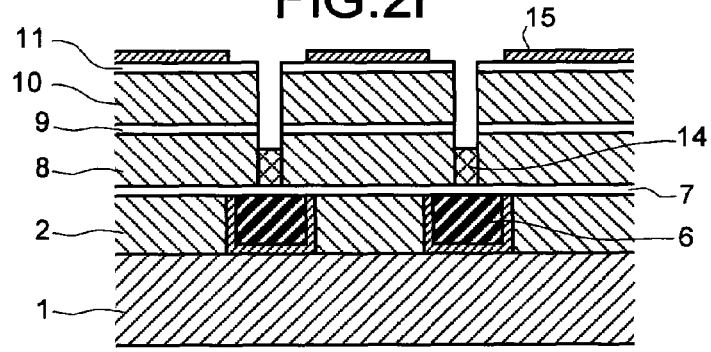
Figure 2G:
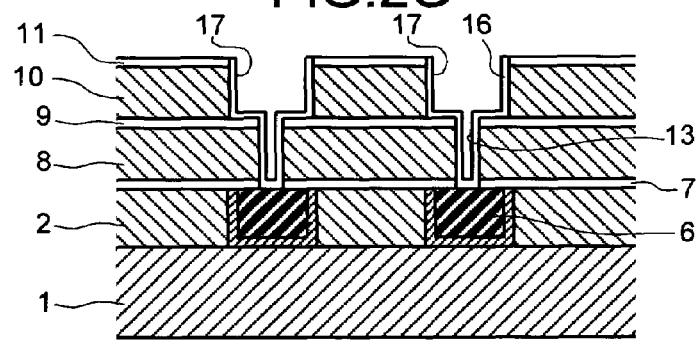
Figure 2H:
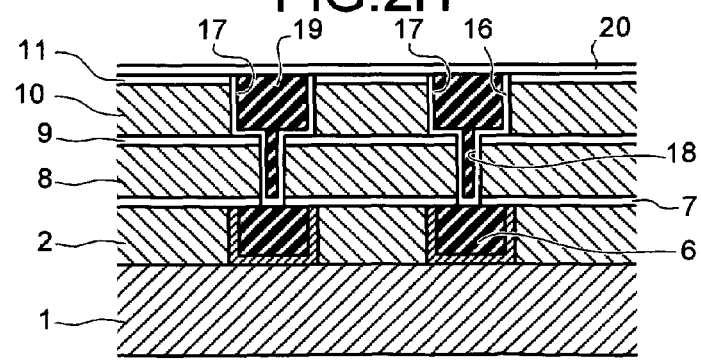

In the drawings, each numeral stands for the following:
1: substrate
2: interlayer insulating layer
3: resist film
4: wiring ditch (trench)
5: barrier metal film (anti-diffusion film)
6: lower wiring layer
7: capping layer
8: the first low-dielectric layer
9: the first etching stopper layer
10: the second low-dielectric layer
11: the second etching stopper layer
12: resist mask
13: via-hole
14: embedding material
15: resist mask
16: wiring ditch (trench)
17: barrier metal film (anti-diffusion film)
18: via-wiring
19: upper wiring layer
20: capping layer
21: conductive layer
8a, 10a: silica-based interlayer insulating layer
13: via
16: trench
30: wiring-layer forming space 31: adhesion layer
32: anti-diffusion film
33: wiring layer
40: monomolecular layer film
41: interlayer insulating layer (Ni compound)
42: copper wiring layer
43: measurement probe

DETAILED DESCRIPTION

Exemplary embodiments of the present invention will be described hereinbelow.

In the present invention, a silica-based interlayer insulating layer having a low dielectric constant is not particularly restricted. For example, a material that may be formed by a CVD method, an SOG method, or the like can be used. Especially, a silica-based interlayer insulating layer having a low dielectric constant made of an SOG-based material is preferable.

Examples of the SOG-based material may include inorganic SOG materials, such as silicate, siloxane hydroxide, and silsesquioxane hydroxide, and organic SOG materials, such as methylsiloxane and methylsilsesquioxane. Particularly, the inorganic SOG materials are preferable because these materials inherently have an anti-diffusion property to some extent.

Examples of the inorganic SOG materials may include a solution obtained by dissolving, in an organic solvent, a hydrolysate obtained by acid-hydrolyzing an alkoxysilane material, such as trialkoxysilane and tetraalkoxysilane.

Examples of the trialkoxysilane may include trimethoxysilane, triethoxysilane, tripropoxysilane, tributoxysilane, diethoxymonomethoxysilane, monomethoxydipropoxysilane, dibutoxymonomethoxysilane, ethoxymethoxypropoxysilane, monoethoxydimethoxysilane, monoethoxydipropoxysilane, butoxyethoxypropoxysilane, dimethoxymonopropoxysilane, diethoxymonopropoxysilane, and monobutoxydimethoxysilane. Among these, preferable compounds in practice are trimethoxysilane, triethoxysilane, tripropoxysilane, and tributoxysilane. Of these, trimethoxysilane and triethoxysilane are particularly preferable. These trialkoxysilane materials may be used singly or in combination of two or more.

Examples of the tetraalkoxysilane may include tetramethoxysilane, tetraethoxysilane, tetrapropoxysilane, tetrabutoxysilane, triethoxymonomethoxysilane, dimethoxydipropoxysilane, tributoxymonomethoxysilane, monoethoxytrimethoxysilane, diethoxydipropoxysilane, trimethoxymonopropoxysilane, triethoxymonopropoxysilane, and dibutoxydimethoxysilane. Among these, preferable compounds in practice are tetramethoxysilane, tetraethoxysilane, tetrapropoxysilane, and tetrabutoxysilane. Of these, tetramethoxysilane and tetraethoxysilane are particularly preferable. These tetraalkoxysilane materials may be used singly or in combination of two or more.

Examples of the organic SOG-based materials may include alkoxysilane materials, such as monoalkyltrialkoxysilane and dialkyldialkoxysilane, containing an Si—R bond, or a solution obtained by dissolving, in an organic solvent, a hydrolysate obtained by acid-hydrolyzing a mixture of any of the alkoxysilane materials mentioned above and any of the alkoxysilane materials exemplified as the inorganic SOG-based materials.

Examples of the monoalkyltrialkoxysilane may include monomethyltrimethoxysilane, monoethyltrimethoxysilane, monopropyltrimethoxysilane, monomethyltriethoxysilane, monoethyltriethoxysilane, monopropyltriethoxysilane, monomethyltributoxysilane, monoethyltributoxysilane, and monopropyltributoxysilane. Also, examples of the dialkyldialkoxysilane may include dimethyldimethoxysilane, diethyldimethoxysilane, dipropyldimethoxysilane, dimethyldiethoxysilane, diethyldiethoxysilane, dipropyldiethoxysilane, dimethyldibutoxysilane, diethyldibutoxysilane, and dipropyldibutoxysilane. These alkoxysilane materials may be used singly or in combination of two or more.

Furthermore, the organic solvent is not particularly restricted, and various solvents may be used. Particularly, in the inorganic SOG-based material whose principal component is trialkoxysilane, alkylene glycol dialkyl ether is preferable. Using this may suppress a decomposition reaction of the H—Si group of trialkoxysilane and reaction in which hydroxyl group of silanol, which is an intermediate product, is substituted by an alkoxy group. These reactions occur in the conventional method using lower alcohol as a solvent. Employment of such preferable solvents may prevent gelation.

Examples of the alkylene glycol dialkyl ether may include dialkyl ethers of alkylene glycols, such as ethylene glycol dimethyl ether, ethylene glycol diethyl ether, ethylene glycol dipropyl ether, ethylene glycol dibutyl ether, diethylene glycol dimethyl ether, diethylene glycol diethyl ether, diethylene glycol dipropyl ether, diethylene glycol dibutyl ether, propylene glycol dimethyl ether, propylene glycol diethyl ether, propylene glycol dipropyl ether, and propylene glycol dibutyl ether. Particularly preferable is dialkyl ether of ethelene glycol or propylene glycol, and more particularly, dimethyl ether. These organic solvents may be used singly or in combination of two or more. An amount of use is normally in a ratio of 10- to 30-fold molar amount per 1 mol of trialkoxysilane.

The SOG material may preferably be prepared in accordance with the following method. First, an alkoxysilane material is dissolved in the organic solvent to have a concentration in a range of 1 to 5 weight percent, preferably at a 2 to 4 weight percent, in terms of $SiO_2$. This is because, if the concentration in terms of $SiO_2$ in a reaction system is too high, gelation occurs to cause deterioration in conservation stability.

Subsequently, the alkoxysilane material is reacted with water for hydrolysis. To accelerate hydrolysis, it is advantageous that the amount of water for use is within a range of 2.5 to 3.0 moles, preferably 2.8 to 3.0 moles, per mole of the alkoxysilane material. If the amount of water for use is smaller than this range, conservation stability may be increased. However, the degree of hydrolysis may be decreased, thereby increasing the amount of an organic group contained in a hydrolysate and increasing the possibility of occurrence of gas at the time of forming a coating. If the amount of water for use is too large, on the other hand, conservation stability may be deteriorated.

This hydrolysis is performed under the presence of an acid catalyst. The acid catalyst for use may include an organic acid or an inorganic acid conventionally used for manufacturing a coating liquid for forming a silane-based coating of the type mentioned above. Examples of the organic acid may include acetic acid, propionic acid, and butyric acid. Examples of the inorganic acid may include hydrochloric acid, nitric acid, sulfuric acid, and phosphoric acid. Particularly, nitric acid is preferable.

In this case, the acid catalyst is added so that the concentration of acid in the coating liquid is normally within a range of 1 to 200 ppm, and preferably 1 to 40 ppm. Alternatively, acid and water may be mixed and added as an acid aqueous solution for hydrolysis.

Hydrolytic reaction is completed normally for approximately 5 to 100 hours. Alternatively, the reaction may be completed in a shorter reaction time by adding water and the acid catalyst dropwise to an organic solvent solution containing the alkoxysilane material at a temperature within a range of room temperature to a temperature not exceeding 70° C.

In the aforementioned method, an alcohol corresponding to an alkoxy group is inevitably generated as a result of the alkoxysilane hydrolysis. When trialkoxysilane is used as a principal component, such an alcohol being generated is preferably removed from the reaction system. Specifically, the alcohol should be removed to reduce the weight percent thereof to 15 weight percent or less, preferably to 8 weight percent or less. The amount of the alcohol is preferably as small as possible. If alcohol remains to exceed 15 weight percent, the generated alcohol reacts with the H—Si group to generate a RO—Si group, thereby decreasing a crack limitation. The remaining alcohol may also generate a gas at the time of forming a coating, and may cause the aforementioned trouble. An exemplary suitable method of removing alcohol may be distillation under the reduced pressure with a degree of vacuum of 30 to 300 mmHg, preferably 50 to 200 mmHg, at a temperature of 20 to 50° C. for 2 to 6 hours.

The silica-based interlayer insulating layer may be formed as follows. Firstly, the coating solution prepared in the aforementioned manner is applied onto a substrate and is then dried for forming a coating film. Application of the coating solution to the substrate may be performed by any of arbitrary methods including a spraying method, a spin-coating method, a dip-coating method, and a roll-coating method. Usually, the spin-coating scheme is used. Means, temperature, and time in the drying process are not particularly restricted as long as the solvent in the coating solution is evaporated to form a coating film. In general, however, heating is performed for approximately 1 to 6 minutes on a hot plate at a temperature of approximately 80 to 300° C. Preferably, it is advantageous that the temperature is increased stepwise with three or more steps. Specifically, a first drying process is performed in the atmosphere or under an inert gas atmosphere such as nitrogen on a hot plate at a temperature of approximately 80 to 120° C. for approximately 30 seconds to 2 minutes. Then, a second drying process is performed at a temperature of approximately 130 to 220° C. for approximately 30 seconds to 2 minutes. Furthermore, a third drying process is performed at a temperature of approximately 230 to 300° C. for approximately 30 seconds to 2 minutes. As such, by performing the drying process stepwise with 3 or more steps, preferably approximately 3 to 6 steps, the surface of the formed coating film may be made uniform.

Subsequently, the dried coating film thus formed in the aforementioned manner is subjected to a baking process at a high temperature to form a baked coating. When the coating film is formed with a coating solution whose principal component is a trialkoxysilane material, it is preferable that the dried coating film is subjected to a baking process under an inert gas atmosphere such as nitrogen at a temperature within a range of 350 to 500° C. Below a temperature of 350° C., the baking process may be insufficient for obtaining a dense silica-based coating. Over a temperature of 500° C., the Si—H bond in the coating may be destroyed, and therefore a dense coating may not be obtained, either. In this manner, a silica-based coating having a film thickness equal to or more than 50 nanometers is formed. An upper limit of the film thickness is not particularly set, but is on the order of 800 nanometers for now.

When the coating is formed with a coating solution whose principal component is a trialkoxysilane material, the surface of the obtained coating has a lot of Si—H bonds. On the other hand, when the coating is formed with monoalkyl-trialkoxysilane or dialkyl-dialkoxysilane, the surface of the obtained coating has a lot of Si—R bonds.

Such Si—H bonds and Si—R bonds may be converted into Si—OH bonds by irradiation with an ultraviolet ray (having a wavelength of 10 to 400 nanometers), preferably an ultraviolet ray containing a far-ultraviolet ray in a region of 180 to 260 nanometers, under an oxidizing atmosphere, such as in the ambient atmosphere, for 10 seconds to 3 minutes, preferably for 30 seconds to 1 minute. This ultraviolet process may be used in combination with another process. Examples of such other process may include an electron-beam irradiating process and a plasma irradiating process with helium (He) plasma, oxygen plasma, or the like. By performing such a process, alkali-resistance and adhesiveness of the coating may be improved. This effect is particularly remarkable when the inorganic SOG material is used.

The Si—H bond and Si—R bond may also be converted into the Si—OH bond by performing a surface processing or an oxygen-plasma processing with a mixed solution of sulfuric acid and hydrogen peroxide.

However, the oxygen-plasma processing acts too strongly. Therefore, for the purpose of converting Si—OH bonds only on the surface of the film, the ultraviolet irradiating process is preferably selected because of its simplicity in operation. Particularly, the Si—H bond is easily changed to the Si—OH bond, and therefore the ultraviolet irradiating process will be sufficient for the conversion.

The temperature of the substrate in the process is not particularly restricted. However, if the temperature is too high, the Si—H bond and the Si—R bond that are required to be on the silica-based coating may be destroyed and converted into $SiO_2$. Therefore, usually, the temperature is preferably room temperature to 250° C. That is, after the baked coating is formed, the temperature of the substrate may be lowered to the room temperature. Alternatively, the substrate may be subjected to the ultraviolet irradiating process on the hot plate right after baking. In the present invention, with such ultraviolet irradiation, the Si—OH bond is caused to occur only on the surface of the silica-based coating having the Si—H bond and the Si—R bond. With the presence of this hydroxyl group, adhesiveness with the silane-based monomolecular layer film provided thereon may be improved.

The film thickness of the silica-based coating thus formed depends on solid content in the coating solution and the method for application. The more the application operation is repeated, the thicker the film thickness of the resulting coating will become. Therefore, the coating solution, the method for applying the solution, and the number of repetitions of the application operation may be appropriately adjusted to obtain a desired film thickness according to the purpose. However, if the number of times of repeating the application operation is excessively increased, throughput may be decreased. Therefore, it is advantageous to prepare a coating solution so that the thickness of the coating film obtained by one application operation is as thick as possible may advantageously be used for obtaining the desired film thickness with the minimum number of repetitions of the application operation. More practically, the operation of applying the coating solution is performed preferably once.

Figure 3:
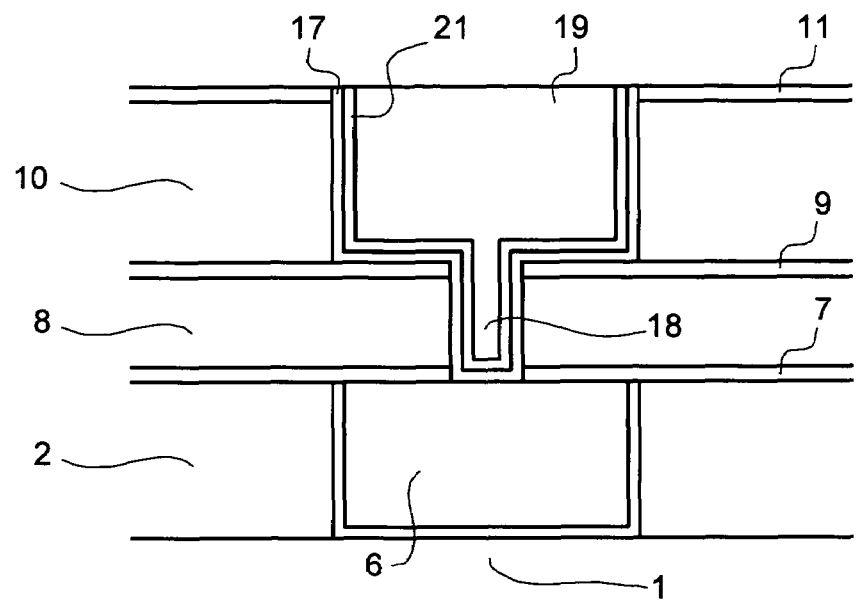
FIG. 3 is an enlarged view of main portions of FIG. 2G.
Figure 4:
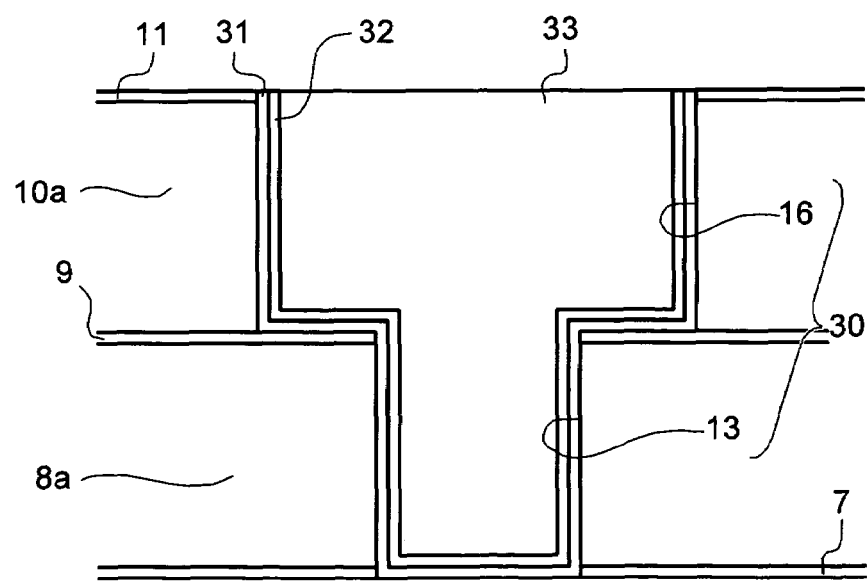
FIG. 4 is an enlarged view for explaining a featured structure of the present invention of main portions of a semiconductor multilayered wiring structure in which an anti-diffusion film is formed in a wiring-layer forming space formed in an interlayer insulating layer and a wiring layer is further formed.

In the present invention, as described above, after the silica-based interlayer insulating layer having a low dielectric constant is formed on the substrate by the CVD method, the application method, or the like, a wiring-layer forming space defined by, e.g., a trench and a via is formed by etching in a manner similar to the conventional manner. The structure of main portion in this state is shown in FIG. 4. In FIG. 4, components identical to those in FIG. 3 are provided with the same reference signs for the sake of simple explanation. In the drawing, reference signs 8a and 10a denote silica-based interlayer insulating layers with low dielectric constant formed by, e.g., the application method with the SOG-based material. The numeral 30 denotes a wiring-layer forming space defined by the via 13 and the trench 16 formed on the interlayer insulating layers 8a and 10a. Subsequently, depending on the surface properties of the silica-based interlayer insulating layer, a process for forming the Si—OH bond on the surface of the insulating layer is performed. Then, the surface of the wiring-layer forming space 30 is processed with an organic-silane compound. With this processing, a monomolecular layer that is preferably made of the organic-silane compound, more preferably an adhesion layer 31 made of a self-organized monomolecular film layer, is formed.

In this case, examples of the organic-silane compound may include silane having an amino group as well as an alkoxy group, such as N-(2-aminoethyl)-3-aminopropyltrimethoxysilane, 3-aminopropyltrimethoxysilane, 2-(trimethoxysilyl)ethyl-2-pyridine, and (aminoethyl)-phenethyltrimethoxysilane, and silane having an epoxy group and an alkoxy group, such as γ-glycidyl propyltrimethoxysilane. Particularly, in view of adhesiveness and catalyst provision property, a silane compound having an amino group as well as an alkoxy group is preferable.

The organic-silane compound may be processed using either one of a vapor phase method and a solution method. In view of simplicity and productivity, formulation by the solution method is preferable. The solution method employs a solution in which the compound is dissolved in a solvent. A substrate having a silica-based interlayer insulating portion with a low dielectric constant may be immersed in the solution. In this case, examples of the solvent for use may include alcohol-based solvents, such as methanol and ethanol, and hydrocarbon-based solvents, such as toluene. Preferably, an alcohol-based solvent, particularly ethanol, is used.

The concentration of the organic silane depends on the period of time for immersing the substrate (or the period of time for making contact with the substrate), and is preferably at a 0.2 to 2 volume percent, particularly around 1 volume percent.

This solution may be used in a temperature range of preferably 20 to 90° C., particularly 40 to 70° C., and more particularly 50 to 60° C. The immersion (contact) time may suitably be determined based on the concentration of the organic silane and the temperature of the solution, and may preferably be 1 minute to 10 hours, and particularly 5 minutes to 2 hours.

In the present invention, after the processing with the organic-silane compound, the excessive organic silane is preferably removed. With this removal, the organic-silane compound adhered to the surface of the lower wiring layer may be removed, thereby causing the lower wiring layer to be revealed while keeping the formed monomolecular layer of the organic-silane compound on the silica-based interlayer insulating layer.

The removal of the excessive organic-silane compound may be performed by contact with an alcohol such as ethanol, or a mixed solution of the alcohol and water, or by immersion in any of such solutions. In terms of high removal efficiency, it is particularly preferable to immerse the substrate having adhered thereto the organic-silane compound into such a solution together with performing ultrasonic cleaning.

Subsequently, in the present invention, the surface of the adhesion layer 31 is modified to be a catalyst with a solution containing a palladium (Pd) compound. Specifically, the substrate may be immersed in the solution containing a silane-compound, particularly a silane-compound having an amino group (or the substrate may be brought into contact with such a solution), thereby preferably forming, on the surface of the wiring-layer forming space 30, a self-organized monomolecular layer chemically-bonded with the surface of the silica-based interlayer insulating layer. Furthermore, the substrate is processed by, for example, immersion in an aqueous solution containing a palladium compound, whereby the amino group on the adhesion layer 31 acquires Pd, thereby making it possible to modify the surface of the wiring-layer forming space 30 to be the catalyst. That is, the inner surface of the wiring-layer forming space 30 having formed thereon a monomolecular layer made of a silane compound, particularly silane molecules having an amino group, has excellent smoothness, and yet can be modified to be the catalyst with the aqueous solution containing the palladium compound.

The aqueous solution containing a palladium compound (hereinafter referred to as catalyst-providing solution) may preferably be an acid aqueous solution containing a water-soluble palladium compound, such as $PdCl_2$ or $Na_2PdCl_4$. In this case, the concentration of the palladium compound is preferably 0.01 to 0.5 gram per liter, particularly 0.04 to 0.1 gram per liter, in terms of palladium. To this catalyst-providing solution, a buffering agent, such as 2-morpholinoethanesulfonic acid, can be added as required, or a stabilizer, such as NaCl, can be added. The pH of the catalyst-providing solution may suitably be determined based on the concentration and type of the buffering agent and the stabilizer. However, the pH thereof must be in a certain range so as to avoid precipitation.

The process to give the catalyzing property using the catalyst-providing solution greatly varies depending on the composition of the solution, and therefore is appropriately set for each solution. Preferably, the process is performed at a temperature in a range of 10 to 50° C., but usually at room temperature. The immersion time is preferably 5 seconds to 60 minutes, and particularly 10 seconds to 30 minutes. To cause the palladium compound to be in a stabilized metal state after the process for giving the catalyzing property, an acceleration process may be performed. An example of an acceleration-process solution may be a dimethylaminoboran aqueous solution.

Subsequently, as shown in FIG. 4, a Co-based compound, such as CoWP, or a Ni compound, such as NiB, NiReP, NiP, or NiWB, is deposited on the adhesion layer 31 that has been given the catalyzing property, by electroless plating to form an anti-diffusion film (barrier-metal film) 32. As a material for the anti-diffusion film 32, NiB is particularly preferable because of a high anti-diffusion property.

An electroless plating bath is not particularly restricted, and may be made of, for example, a material disclosed in Japanese Patent Laid-Open Publication No. 2003-51538. For example, an electroless cobalt-tungsten-phosphorus bath, an electroless nickel-tungsten-phosphorus bath, an electroless nickel-rhenium-phosphorus bath, or an electroless nickel-boron bath is preferably used.

The pH value of the plating bath is appropriately set, and is preferably set to pH 5 to 10. The plating conditions may be selected from conventional ones which are suitable for each plating bath. For example, the plating temperature is preferably 50 to 90° C., particularly 60 to 80° C. The plating time may be appropriately set to obtain a desired film thickness. The film thickness of the plated film produced in this plating procedure is preferably 5 to 100 nanometers, particularly 10 to 50 nanometers.

After forming the anti-diffusion film 32 in the manner described above, a heating process may be performed at 300 to 450° C., particularly at 300 to 350° C., for 10 to 30 minutes, particularly 25 to 30 minutes. This makes it possible to further improve adhesiveness. However, in the course of forming a semiconductor multilayer wiring board, a heating process is always included. Therefore, even if the heating process is not performed at this stage, adhesiveness may be eventually improved.

In the present invention, after the anti-diffusion layer is formed in this manner, as shown in FIG. 4, a wiring layer 33 may be directly formed thereon. In this case, the wiring layer 33 may be formed by copper electroplating or copper electroless plating. The anti-diffusion film 32 formed by the plating has conductivity, and therefore a copper wiring layer may be formed by copper electroplating. In order to stabilize the plating, a conductive layer may be formed on the anti-diffusion film by electroless plating. Furthermore, the anti-diffusion film 32 formed by the electroless plating method also has an activity to catalyze the reaction in other electroless plating baths. Therefore, a copper wiring layer may be formed by electroless plating with copper. By forming a copper wiring layer on the anti-diffusion layer by the plating method, the semiconductor multilayer wiring structure may be formed through an all-wet process.

The copper electroplating may be achieved by using a known copper electroplating bath, such as a copper-sulfate bath, a fluoboric-acid-copper bath, or a pyrophosphoric-acid-copper bath, under known conditions depending on each plating bath. Particularly, a copper-sulfate bath is preferable. It is preferable to use a combination of a variety of additives to form a film on a fine part. That is, in the present invention, a wiring layer may be easily formed by the conventional methods.

EXAMPLES

The present invention will be explained with reference to the Examples in further detail. The following examples are merely examples for suitably explaining the present invention, but does not limit the present invention.

Example 1

Formation of the Semiconductor Multilayer Wiring Board and its Property

A spin-on-glass coating solution (manufactured by Tokyo Ohka Kogyo Co., Ltd. under the trade name of OCD T-12 800) whose principal component is a hydrolysate of trialkoxysilane as an inorganic SOG material was applied to a silicon substrate for 20 seconds by a spinner at 2000 rpm. Then, the substrate was dried on a hot plate at 80° C. for 1 minute, at 150° C. for 1 minute, and then at 200° C. for 1 minute. Then, the substrate was subjected to a heat processing under a nitrogen atmosphere at 450° C. for 30 minutes to obtain a coating film having a film thickness of 400 nanometers. The dielectric constant of the obtained silica-based interlayer insulating film was 3.0.

In the silica-based interlayer insulating film, a wiring-layer forming space was formed through a dual damascene process. Then, the substrate having formed thereon the silica-based interlayer insulating film was irradiated with an ultraviolet ray containing a far-ultraviolet ray of 185 to 254 nanometers for 1 minute in the ambient atmosphere with an ultraviolet irradiating apparatus Deep UV processor (manufactured by Japan Storage Battery Co., Ltd.). With this, an operation of converting the Si—H bond on the surface of the silica-based interlayer insulating layer into the Si—OH bond was performed.

Thereafter, this substrate was immersed in an N-(2-aminoethyl)-3-aminopropyltrimethoxysilane-ethanol solution having a composition shown in Table 1 at 50° C. for 10 minutes, thereby forming an organic silane monomolecular layer film on the inner surface of the wiring-layer forming space. Subsequently, the substrate was immersed in ethanol, and then excessive organic silane molecules were removed by ultrasonic cleaning. Then, the substrate was immersed in an aqueous solution containing $PdCl_2$ having a component concentration shown in Table 2 at room temperature for 30 seconds, thereby giving the catalyzing activity to the surface of the monomolecular layer film. The substrate pulled out from the solution was cleansed with ethanol.

Subsequently, this substrate was immersed in an electroless plating bath having a component concentration shown in Table 3 for 3 to 8 minutes, thereby forming an anti-diffusion film. The surface of the obtained wiring-layer forming space entirely and uniformly had a metallic luster.

TABLE 1

| Component | Amount (g) |
|---|---|
| N-(2-aminoethyl)-3-aminopropyltrimethoxysilane | 0.4 |
| Toluene | 39.4 |

TABLE 2

| Component | Concentration (g/L) |
|---|---|
| HCl | 0.43 |
| $PdCl_2$ | 0.10 |
| pH | Unadjusted |

TABLE 3

| Component | Concentration (mol/L) |
|---|---|
| Sodium citrate | 0.20 |
| $NiSO_4$ | 0.10 |
| Dimethylamineborane | 0.05 |
| pH (adjusted with NaOH) | 9.0 |

The anti-diffusion film exhibited an excellent thermal stability up to 400° C., and therefore was confirmed to have a sufficient capability as an anti-diffusion film.

After formation of the anti-diffusion film, copper plating was performed with a copper electroplating bath having a composition shown in Table 4. As a result, excellent direct plating was achieved. Therefore, it was confirmed that a wiring layer can be formed by direct copper plating.

TABLE 4

| Component | Concentration |
|---|---|
| $CuSO_4 \cdot 5H_2O$ | 0.26 mol/L |
| $H_2SO_4$ | 2.0 mol/L |
| $Cl^-$ | 50 ppm |
| Polyethylene glycol | 100 ppm |
| Bis(3-sulfopropyl) disulfide | 10 ppm |

Examples 2 and 3

Evaluation of the Anti-Diffusion Property of the Anti-Diffusion Film in the Semiconductor Multilayer Wiring Board According to the Present Invention The spin-on-glass coating solution (manufactured by Tokyo Ohka Kogyo Co., Ltd. under the trade name of OCD T-12 800) was used as an inorganic SOG-based material to form a silica-based interlayer insulating layer. Then, by using a helium (He) plasma irradiating process and an ultraviolet irradiating process as a process for forming the Si—OH bond on the surface of the silica-based interlayer insulating layer, pseudo-models of the semiconductor multilayer wiring boards of the present invention were formed in the following manner. With the use of the formed pseudo-models, the anti-diffusion property of the anti-diffusion film in the semiconductor multilayer wiring board according to the present invention was evaluated. Although this pseudo-model did not include a wiring forming space, the anti-diffusion film in this pseudo-model was identical to the anti-diffusion film in the semiconductor multilayer wiring board according to the present invention. Therefore, this pseudo-model can be used for evaluating the anti-diffusion property.

The spin-on-glass coating solution (manufactured by Tokyo Ohka Kogyo Co., Ltd. under the trade name of OCD T-12 800) whose principal component is a hydrolysate of trialkoxysilane was applied to a silicon substrate for 20 seconds by a spinner at 2000 rpm. Then, the substrate was dried on a hot plate at 80° C. for 1 minute, at 150° C. for 1 minute, and then at 200° C. for 1 minute. Then, the substrate was subjected to a heat processing under a nitrogen atmosphere at 450° C. for 30 minutes to obtain a coating having a film thickness of 400 nanometers. The dielectric constant of the obtained silica-based interlayer insulating film was 3.0.

Then, the substrate having formed thereon the silica-based interlayer insulating film was subjected to a He plasma irradiating process and was irradiated for 1 minute with an ultraviolet ray including a far-ultraviolet ray of 185 to 254 nanometers in the ambient atmosphere by using an ultraviolet irradiating apparatus Deep UV processor (manufactured by Japan Storage Battery Co., Ltd.). With this, an operation of converting the Si—H bond on the surface of the silica-based interlayer insulating layer into the Si—OH bond was performed.

Thereafter, this substrate was immersed in the N-(2-aminoethyl)-3-aminopropyltrimethoxysilane-ethanol solution having the composition shown in Table 1 at 50° C. for 10 minutes, thereby forming an organic silane monomolecular layer film on the surface of the silica-based interlayer insulating layer. Subsequently, the substrate was immersed in ethanol, and then excessive organic silane molecules were removed by ultrasonic cleaning. Then, the substrate was immersed in the aqueous solution containing $PdCl_2$ having the component concentration shown in Table 2 at room temperature for 30 seconds, thereby giving the catalyzing activity to the surface of the monomolecular layer film. The substrate pulled out from the solution was cleansed with ethanol.

Subsequently, this substrate was immersed in the electroless plating bath having the component concentration shown in Table 3 for 3 to 8 minutes, thereby forming an anti-diffusion film having a film thickness of 20 nanometers (Example 2) and 40 nanometers (Example 3). The surfaces of the obtained silica-based interlayer insulating films entirely and uniformly had a metallic luster.

On each of the anti-diffusion films, copper having a thickness of 100 nanometers was laminated by a vapor deposition method to form pseudo-models 1 and 2 of the semiconductor multilayer wiring boards of the present invention. This copper was deposited as a copper wiring metal.

Figure 5:
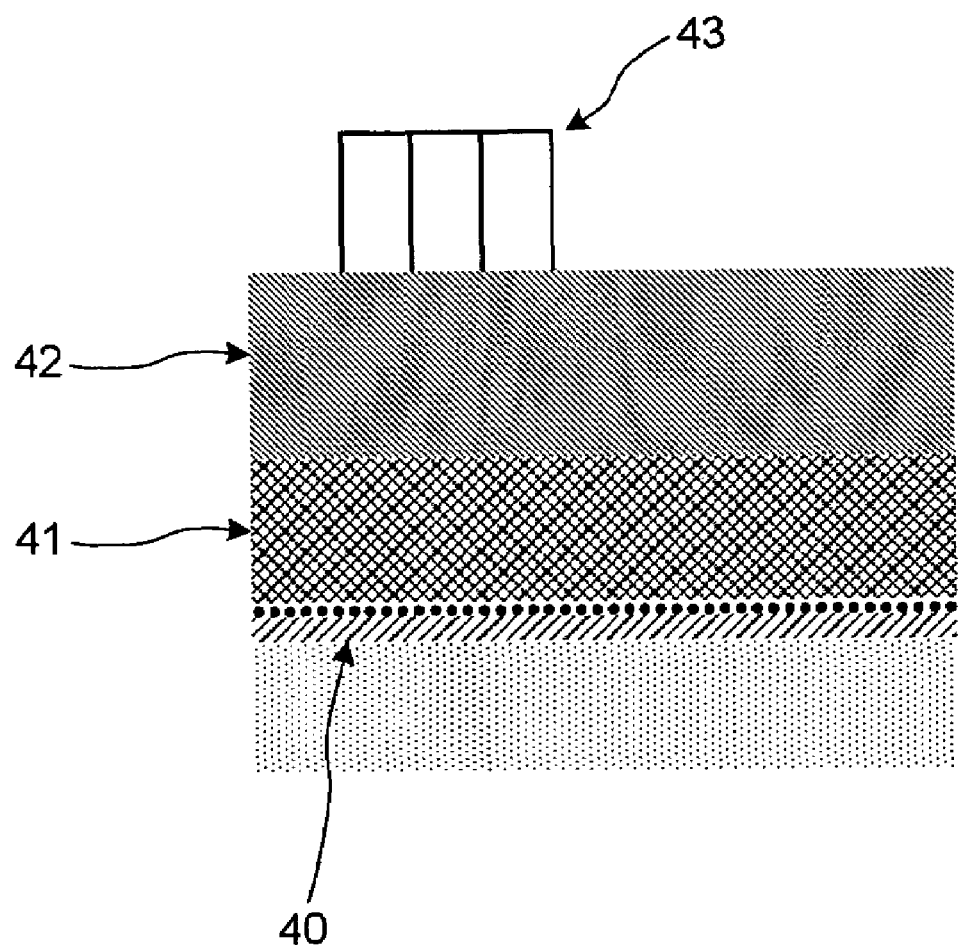
FIG. 5 is a view depicting a method of evaluating an anti-diffusion property by a four-probe method.

The obtained pseudo-models 1 and 2 of the semiconductor multilayer wiring boards of the present invention were subjected to annealing under a vacuum atmosphere at 100, 200, 300, and 500° C. for 30 minutes each. Then, as shown in FIG. 5, a four-probe measurement was performed to measure resistances from over the surface of copper and their changes were observed. Resistances (ohm $sq^{-1}$) (on the vertical axis) after annealing at the respective temperatures (on the horizontal axis) were plotted as a graph shown in FIG. 6 (Examples 2 and 3).

The four-probe measurement is a method of evaluating an anti-diffusion property by using the fact that interdiffusion among copper, the anti-diffusion film, and the substrate decreases a bulk copper portion, thereby increasing a resistance.

Examples 4 and 5

Evaluation of the Anti-Diffusion Property of the Anti-Diffusion Film in the Semiconductor Multilayer Wiring Board According to the Present Invention A spin-on-glass coating solution (manufactured by Tokyo Ohka Kogyo Co., Ltd. under the trade name of OCD T-9) whose principal component is a hydrolysate of methyltrialkoxysilane was used as an organic SOG-based material. Then, a process of forming the Si—OH bond on the surface of the silica-based interlayer insulating film was performed in the same manner as in Examples 2 and 3 except that an ultraviolet-ray irradiating process was the irradiation for 1 minute of an ultraviolet ray including a far-ultraviolet ray of 185 to 254 nanometers in the ambient atmosphere, thereby forming pseudo-models 3 and 4 of the semiconductor multilayer wiring boards of the present invention.

The obtained pseudo-models 3 and 4 of the semiconductor multilayer wiring boards of the present invention were subjected to annealing under a vacuum atmosphere at 100, 200, 300, and 500° C. for 30 minutes each. Then, as shown in FIG. 5, a four-probe measurement was used to measure resistances from over the surface of copper and their changes were observed. Resistances (ohm $sq^{-1}$) (on the vertical axis) after annealing at the respective temperatures (on the horizontal axis) were plotted as a graph shown in FIG. 6 (Examples 4 and 5).

Evaluation Results of the Anti-Diffusion Property

Figure 6:
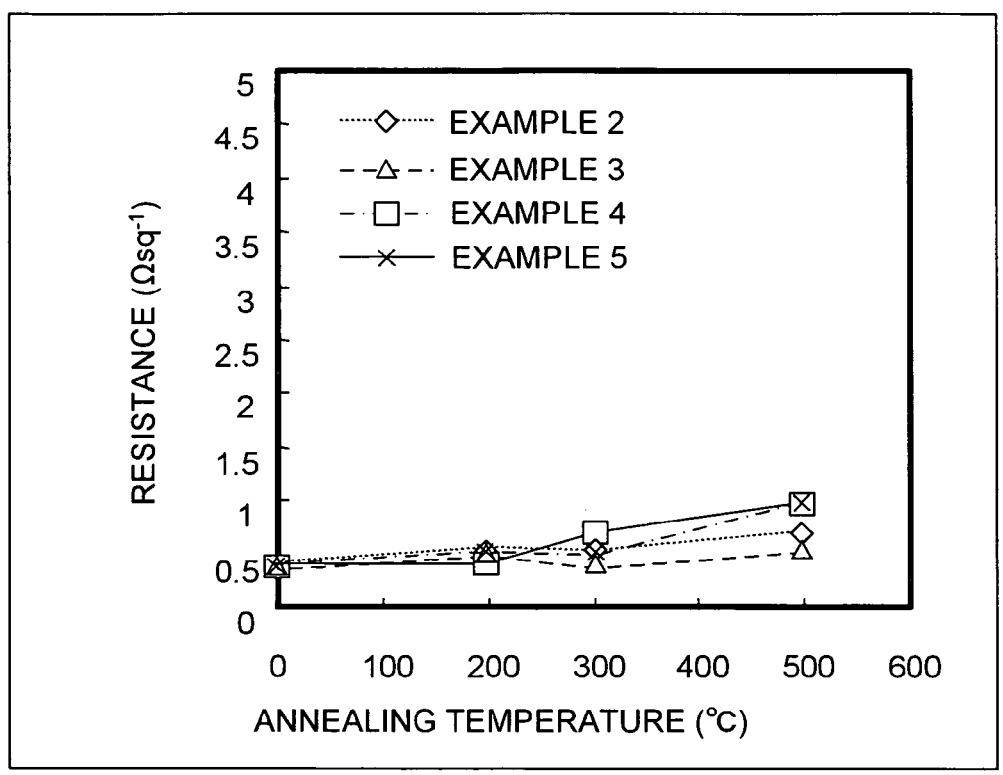
FIG. 6 is a graph depicting changes in resistance with respect to an annealing temperature of the anti-diffusion film in a semiconductor multilayered wiring board according to the present invention.

As shown in the graph of FIG. 6, in Examples 2 to 5 using the pseudo-models 1 to 4, respectively, of the semiconductor multilayer wiring boards of the present invention, no large change in resistance was observed, and therefore it was revealed that diffusion did not occur. The results indicate an excellent anti-diffusion property of the anti-diffusion film in the pseudo-models of the semiconductor multilayer wiring board according to the present invention. The results also indicate that the anti-diffusion film further provided with a wiring forming space formed through a dual damascene process in the semiconductor multilayer wiring board according to the present invention also has an excellent anti-diffusion property.

Among others, in Examples 2 and 3, affinity between the silica-based interlayer insulating film (inorganic SOG-based material) and the anti-diffusion film was excellent. This might be because the silica-based interlayer insulating films used in Examples 2 and 3 inherently had a barrier property to some extent.

From the aforementioned results, it was confirmed that the semiconductor multilayer wiring board according to the present invention has an excellent anti-diffusion property even with a heat process at 500° C.

As has been described in the foregoing, according to the present invention, it was possible to provide a semiconductor multilayer wiring board having a high quality at a low cost without the problem of the electric signal delay due to the fine wiring size in which a silica-based interlayer insulating layer having a low dielectric constant is formed on a substrate; a dense, thin anti-diffusion film is formed by a technique of forming an organic monomolecular film, which is a wet process, in a wiring forming space formed by a dual damascene process; and then a wiring layer is formed through a wet process. The production of the interlayer insulating layer with the SOG material enabled a true full-wet processing of the all of the steps, which simplified the production steps and reduced the production costs, and thus enabled to provide a method for producing the semiconductor multilayer wiring board having an excellent anti-diffusing property.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims along with their full scope of equivalents.

What is claimed is:

1. A semiconductor multilayer wiring board having a semiconductor multilayer wiring, said semiconductor multilayer wiring board comprising:
    a lower wiring layer formed on a semiconductor substrate;
    a silica-based interlayer insulating layer having a low dielectric constant and made of a spin-on-glass (SOG) material, said silica-based interlayer insulating layer having a wiring-layer-forming space formed therein by a dual damascene process;
    a silane-based monomolecular layer film on an inner surface of said wiring-layer-forming space in said silica-based interlayer insulating layer;
    a plated film on a surface of said monomolecular layer film;
    an upper wiring layer formed on said lower wiring layer via said silica-based interlayer insulating layer; and
    a copper wiring layer on said plated film such that said lower wiring layer and said upper wiring layer are connected to each other by said copper wiring layer vertically penetrating through said silica-based interlayer insulating layer.

2. The semiconductor multilayer wiring board of claim 1, wherein said silica-based interlayer insulating layer is sandwiched between said lower wiring layer and said upper wiring layer.

3. The semiconductor multilayer wiring board of claim 1, wherein said silica-based interlayer insulating layer has a dielectric constant equal to or less than 3.5.

4. The semiconductor multilayer wiring board of claim 1, wherein said plated film on said surface of said monomolecular layer film is one of a Co-based plated film and a Ni-based plated film.

5. A method of forming a semiconductor multilayer wiring board including a semiconductor multilayer wiring having a lower wiring layer formed on a semiconductor substrate, and an upper wiring layer formed on the lower wiring layer via a silica-based interlayer insulating layer having a low dielectric constant, the lower wiring layer and the upper wiring layer being connected to each other by a copper wiring layer vertically penetrating the interlayer insulating layer, said method comprising:
    forming the silica-based interlayer insulating layer having the low dielectric constant and which is made of spin-on-glass (SOG) material on the substrate;
    forming a wiring-layer-forming space in the silica-based interlayer insulating layer by a dual damascene process;
    forming an Si—OH bond on a surface of the silica-based interlayer insulating layer;
    processing an inner surface of the wiring-layer-forming space with an organic-silane compound whereby a silane-based monomolecular layer film is adhered thereto;
    treating a surface of the monomolecular layer film with an aqueous solution containing a palladium compound to give catalyzing activity to the surface;
    forming a plated film with a high copper-diffusion resistant property on the catalyst monomolecular layer film by electroless plating so as to obtain a copper-diffusion-resistant film; and
    forming a copper layer on the copper-diffusion-resistant film so as to obtain the copper wiring layer.

6. The method of claim 5, wherein said forming of the silica-based interlayer insulating layer comprises forming the silica-based interlayer insulating layer between the upper wiring layer and the lower wiring layer.

7. The method of claim 5, wherein said forming of the Si—OH bond on the surface of the silica-based interlayer insulating layer comprises at least an ultraviolet irradiating process of irradiating the silica-based interlayer insulating layer with an ultraviolet ray under an oxidizing atmosphere.

8. The method of claim 5, wherein said processing of the inner surface of the wiring-layer-forming space to form the silane-based monomolecular layer film is followed by removal of an excessive organic-silane compound to expose the lower wiring layer, said removal of the excessive organic-silane compound is then followed by said treating of the surface of the monomolecular layer film with an aqueous solution.

9. The method of claim 5, wherein said electroless plating is one of Co-based plating and Ni-based plating.

* * * * *